(12) United States Patent
Bukkems et al.

(10) Patent No.: US 9,115,853 B2
(45) Date of Patent: Aug. 25, 2015

(54) LIGHTING DEVICE

(75) Inventors: Peter Johannes Martinus Bukkems, Deurne (NL); Antonius Adrianus Maria Marinus, Eindhoven (NL); Hans Nikol, Aachen (DE); Arie Van Der Padt, Maastricht (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 13/978,547

(22) PCT Filed: Jan. 4, 2012

(86) PCT No.: PCT/IB2012/050039
§ 371 (c)(1),
(2), (4) Date: Jul. 8, 2013

(87) PCT Pub. No.: WO2012/095758
PCT Pub. Date: Jul. 19, 2012

(65) Prior Publication Data
US 2013/0286645 A1    Oct. 31, 2013

Related U.S. Application Data

(60) Provisional application No. 61/569,353, filed on Dec. 12, 2011.

(30) Foreign Application Priority Data

Jan. 11, 2011    (EP) .................................... 11150537

(51) Int. Cl.
F21V 29/00    (2006.01)
F21K 99/00    (2010.01)
F21V 3/02    (2006.01)
F21V 19/00    (2006.01)
F21V 17/10    (2006.01)
F21V 29/506    (2015.01)
F21V 23/06    (2006.01)
F21Y 101/02    (2006.01)
(Continued)

(52) U.S. Cl.
CPC ............... *F21K 9/1355* (2013.01); *F21K 9/135* (2013.01); *F21K 9/90* (2013.01); *F21V 3/02* (2013.01); *F21V 17/10* (2013.01); *F21V 19/004* (2013.01); *F21V 23/06* (2013.01); *F21V 29/2212* (2013.01); *F21V 29/506* (2015.01); *F21V 29/86* (2015.01); *F21Y 2101/02* (2013.01); *F21Y 2103/022* (2013.01); *Y10T 29/49128* (2015.01)

(58) Field of Classification Search
CPC ....... F21V 29/00; F21V 29/004; F21V 29/20; F21V 29/2206; F21V 15/011; F21V 19/003; F21V 19/0035
See application file for complete search history.

(56) References Cited

U.S. PATENT DOCUMENTS 4,729,076 A *  3/1988  Masami et al. ................ 362/235
6,441,943 B1 * 8/2002  Roberts et al. ................ 359/267
(Continued)

FOREIGN PATENT DOCUMENTS

EP    0735556 A2    10/1996
WO    2010143204 A2    12/2010
WO    2010150883 A1    12/2010

*Primary Examiner* — Ismael Negron
(74) *Attorney, Agent, or Firm* — Yuliya Mathis

(57) ABSTRACT

A lighting device includes at least one light source arranged in contact with an electrically conducting layer, and mechanically secured to an electrically insulating heat sink element.

21 Claims, 9 Drawing Sheets

(51) Int. Cl.
*F21Y 103/02* (2006.01)
*F21V 29/85* (2015.01)

(56) References Cited

U.S. PATENT DOCUMENTS

| | | | |
|---|---|---|---|
| 7,086,767 B2* | 8/2006 | Sidwell et al. | 362/545 |
| 7,192,163 B2* | 3/2007 | Park | 362/294 |
| 7,285,903 B2* | 10/2007 | Cull et al. | 313/500 |
| 7,348,604 B2* | 3/2008 | Matheson | 257/98 |
| 7,465,069 B2* | 12/2008 | Li | 362/294 |
| 7,918,591 B2* | 4/2011 | Lynch | 362/365 |
| 7,942,549 B2* | 5/2011 | Li | 362/249.02 |
| 2002/0176250 A1* | 11/2002 | Bohler et al. | 362/236 |
| 2004/0080939 A1* | 4/2004 | Braddell et al. | 362/240 |
| 2007/0047238 A1* | 3/2007 | Vukosic et al. | 362/368 |
| 2007/0090737 A1* | 4/2007 | Hu et al. | 313/11 |
| 2009/0103296 A1 | 4/2009 | Harbers et al. | |
| 2009/0154180 A1* | 6/2009 | Cho et al. | 362/459 |

* cited by examiner

LIGHTING DEVICE

FIELD OF THE INVENTION

The present invention relates generally to a lighting device and to a method for assembly of a lighting device, which are suitable for mass production of retrofit LED bulbs.

BACKGROUND OF THE INVENTION

For a high market penetration of light emitting diode lighting devices (LED lighting devices), retrofit lamps are of high importance. Retrofit lamps based on LEDs are typically used for replacing traditional incandescent lamps, and are herein after referred to as LED bulbs. A typical solution for arranging the LEDs in a retrofit lamp, like for instance the Endura LED Bulb from Philips, is to arrange LEDs on printed card boards, PCBs, which PCBs are then mounted with metal screws to a metal heat sink which forms part of the base of the LED bulb. The metal heat sink is typically prepared with predrilled holes such that the PCBs can be mounted at a predetermined position. Further, the LED bulb typically comprises a cap connected to the base and a glass bulb arranged to enclose the LEDs.

While the system described above is generally effective in accomplishing an effective LED bulb, in which the heat generated by the LEDs are evacuated via the metal heat sink, there is a need for an alternative method for mounting the LEDs in a LED bulb.

SUMMARY OF THE INVENTION

It is an object of the present invention to at least provide an improved lighting device and a method for assembling such a lighting device, which is well suited for mass production.

This object is achieved by a lighting device and method according to the present inventive concept as defined in the appended independent claims. Preferred embodiments are set forth in the dependent claims and in the following description and drawings.

Thus, in accordance with a first aspect of the present inventive concept, there is provided a lighting device comprising at least one light source arranged to generate light, an electrically insulating heat sink element, and an electrically conducting layer. The at least one light source is arranged at least in thermal contact, but preferably also in electric contact, with the electrically conducting layer, and the electrically conducting layer is mounted to the heat sink element by means of a mechanical fastening means. Thus, to achieve a good fixation of the electrically conductive layer onto the heat sink, a mechanical fastening means is utilized, which is beneficial as compared to e.g. gluing, or coating techniques, e.g. utilizing thick-layer technologies, or thin film processes, which all require expensive equipment and complicated processing in need of curing, usage of chemicals. Further, with proper design of the mechanical fastening means, it can be utilized as an advantageous way of aligning the one or more light sources into predetermined positions on the heat sink element. This may be achieved for instance by providing a mechanical fastening means with a recess to receive the light source (which typically is arranged such that it is protruding upwards from the electrically conductive layer). When fastening the electrically conductive layer and the light source, the light source is guided by the recess, such that a predetermined position on the heat sink element is obtained for the light source. Further, the design of the fastening means may be done such that alignment of the fastening means itself is facilitated, e.g. by utilizing the shape of the heat sink element. It should be noted that the fastening means may be of friction-locking (non-positive) type as well as of form-locking (positive) type.

In preferred embodiments of the lighting device, the electrically conductive layer is arranged between the light source and the electrically insulating heat sink element, thereby providing a low thermal resistance between the heat generating light source and the heat sink element. Thereby efficient heat transfer from the light source and heat spreading to the heat sink element are accomplished. A low thermal contact resistance is for instance achieved when using copper, or a copper alloy, to form the electrically conductive layer, which is then arranged in direct contact with for instance a ceramic heat sink element. This arrangement requires less parts than the prior art PCB mounted lighting device as discussed above. Further, the fastening means may be arranged such that predetermined degree of freedom of movement is allowed, which decreases the impact of Coefficient of Thermal Expansion, CTE, mismatch. This in turn means less solder cracks at high temperatures (above 100° C.). It should be noted that the electrically conductive layer may be monolithic or multilayered, e.g., including a lead frame deposited on an electrically insulating, thermally conductive substrate for connecting the light source to a power source.

According to an embodiment of the lighting device, the fastening means is arranged for distributing a mechanical force at predetermined positions. The positions may advantageously be selected on the electrically conductive layer and in the direct vicinity of the at least one light source. Thereby, in addition to fastening the electrically conducting layer on to the heat sink element, the fastening means may provide for sufficient thermal connection between the electrically conducting layer and the heat sink element at thermally critical positions, i.e. directly at heat sources. This may be achieved for instance by selecting an appropriate design of the top and bottom contact surfaces of the fastening means. That is, the fastening means is designed such that the electrically conducting layer and the heat sink element are pressed together by the fastening means at the predetermined positions. As mentioned above, these positions are preferably selected close to each light source, such that a good thermal contact close to each heat generating light source is provided. Thereby, in one assembly step, the electrically conducting layer, which is in contact with the light sources, is fixated to the heat sink element, while the mechanical force from the fastening means is distributed to provide sufficient thermal contact close to the light sources (or any other heat generating component), in an effective manner.

Further, by applying separate pressure points for each light source, the lighting device becomes less sensitive to irregularities in or flatness faults of the heat sink element surface. This will reduce the cost for production of thermal contact surfaces, as less attention to the flatness is required.

According to an embodiment of the lighting device, the fastening means is a clamp. The clamp may be made of a metal, but can also be provided in an electrically insulating material. By utilizing a clamp, a good thermal contact between the electrically conducting layer and the heat sink element is obtained in a convenient way. The clamp may advantageously be arranged to apply a predetermined force to accomplish a sufficient thermal contact between the electrically conducting layer and the heat sink element, as described above. The mounting of the clamp may be done in one assembly step. The advantages of the fastening means being a clamp, for instance when comparing to using screws for fastening of a PCB onto the heat sink as in prior art are many. The latter requires multiple steps to complete the mounting, and a delicate handling of e.g. the screws. Further, applying the right amount of torque to the screws is crucial, as a too high torque may result in a damaged PCB, while a too low torque may result in an inadequate thermal contact between the PCB and its heat sink (here corresponding to the heat sink element). However, using a clamp in accordance with the present inventive concept allows for providing a very accurately defined clamping force and quick assembly.

According to an embodiment of the lighting device, the electrically conducting layer is arranged having electrical leads arranged for powering of the at least one light source. The electrically conducting layer is preferably, in addition to providing the thermal coupling between the light source and the heat sink element, designed for providing the electrical leads arranged for powering the light source which is advantageous.

According to an embodiment of the lighting device, the electrically conducting layer is flexible. A flexible electrically conducting layer is advantageous as it may be folded e.g. around the heat sink element. Further, a flexible electrically conducing layer provides an improved contact area between itself and the heat sink element.

According to an embodiment of the lighting device, it further comprises an insulating layer arranged at the electrically conducting layer. The insulating layer may be arranged to support the electrically conducting layer, for instance when the electrically conducting layer has cut out/stamped out lead patterns. It may further be arranged as a top layer, covering most of the upper surface, except for areas where the light source(s) is to be placed. The insulating layer can then be used to increase the safety of the lighting device by insulating live parts, in case of a broken envelope (glass bulb) of the lighting device, etc. The insulating layer may further be utilized for positioning functions. It should be noted that the insulating layer may also be an integrated part of the electrically conductive layer.

According to an embodiment of the lighting device, the insulating layer (if present) and/or the fastening means are reflective, which is advantageous for providing a good light performance, i.e. to achieve a high optical efficiency of the lighting device.

According to an embodiment of the lighting device, the electrically conductive layer is arranged in the fastening means. The electrically conductive layer may for instance be arranged covering the contact surfaces of a plastic clamp, and be applied as electrical leads which are arranged for connecting the light source to a power source. Thereby a convenient way of arranging the electrical leads to the light source is provided, while at the same time providing a sufficient thermal connection between the light source and the heat sink element.

According to an embodiment of the lighting device, the electrically conductive layer and the fastening means coincide. The fastening means may for instance be a metal clamp on which the light source is mounted. This provides a good thermal connection between the light source and the heat sink element and keeps the number of components low. The electric powering of the light source may be provided by the electrically conductive layer, but may also be achieved by dedicated electric connection means. The light source may be, e.g., a LED package or chip-on-board (COB). Here, a LED package may refer to LEDs with protective coating or some kind of mechanical reinforcement, not primarily to LEDs with unprotected downward facing leads that are to be soldered or surface mounted directly to a substrate. However, the light source may as well be provided in the form of one or more LEDs on a naked die (that is, without a dedicated protective coating) forming the electrically conducting layer. The die is mounted directly on top of the heat sink element, so that heat is dissipated away from the LEDs via the die to the heat sink element, at low thermal resistance. Regardless of whether a package or a naked die is utilized, the preferred way of connecting the light source is by wire bonding. It is noted that this embodiment is fully operational even if the die is not electrically conducting; it is important, however, that the die has good thermal conductivity in the transverse direction.

According to an embodiment of the lighting device, the mechanical fastening means is a recess in the heat sink element having a shape corresponding to that of the electrically conductive layer. By a recess is meant also a nock, cavity or hole which can be used to help align the light source. When the electrically conductive layer is received in the recess, the movement of the electrically conductive layer in its own plane is limited. Additionally, the electrically conductive layer is glued to the heat sink element. The light source may be, e.g., a LED package or chip-on-board (COB). The present embodiment has a small number of components, and since the recess can be molded or cut out as part of the manufacture of the heat sink element, the present embodiment is easy to assemble. If needed, an extra clip may be arranged to help keep the conductive layer fixed to the heat sink element. This furthers the thermal connection to the heat sink.

According to an embodiment of the lighting device, flexible linear electric connection means are arranged so that they extend all the way up to the light source to provide electric power. This is preferable since the electrically conductive layer need not include a lead frame for electric power to be supplied. The linear connection means may for instance be wires, insulated or non-insulated. Moreover, the linear connection means may extend from inside of the lamp cap, where driving circuitry or a power supply may be located, all the way to the light source or to conductive leads connecting the linear connection means to the light source. Wire bonding is the currently preferred way of connecting the linear connection means to the light source or to its conductive leads. The use of flexible linear electric connection means is preferable since it increases the shock resistance of the lighting device compared to embodiments with lead frames or other large rigid components.

According to an embodiment of the lighting device, each flexible linear electric connection means is located on that side of the heat sink element which is opposite to the light source, up to which this linear connection means extends. Thereby, the linear connection means do not obscure of the light emitted from the light sources.

According to an embodiment of the lighting device, the heat sink element comprises two overlapping parts. These parts are separated by a positive distance, so that an overlap zone is formed in between, in which the electric connection means are located. This is preferable since the linear connection means are held in position by the heat sink element. The overlapping parts may for instance be parallel plates separated by an essentially constant distance of e.g. 1-10 millimeters. The overlap zone is preferably located in a central region of the lamp.

According to an embodiment of the lighting device, it comprises an envelope enclosing the light source and the heat sink element, which is advantageous.

According to an embodiment of the lighting device, the heat sink element is thermally coupled to the envelope, providing a lighting device which has its light source(s) arranged inside the envelope and on a heat sink element which is thermally connected to the envelope. Thereby efficient heat transfer from the light source and heat spreading to the heat sink element and envelope are accomplished.

According to an embodiment of the lighting device, at least part of the heat sink element and the envelope are one single integrated part. That is, the heat sink element is part of the envelope, e.g. the glass bulb or a light bulb. Less parts are then required, and the manufacturing is made simpler, e.g. molding the heat sink element and the envelope in a common mould and from the same material is made possible.

According to an embodiment of the lighting device, the heat sink element comprises a ceramic material, which is advantageous. A preferred material is a translucent poly crystalline aluminum oxide, PCA. It can be provided with excellent optical properties for light bulbs, such as providing a high total light transmission while providing a desired light scattering to vanish point light sources like LEDs. In addition PCA provides a very good electrical insulation, and has a thermal conductivity of 35 W/mK. Thereby, the thermal management of the lighting device is improved. This allows for a high level of function integration of the device, thereby decreasing the amount of parts which are necessary for lamps utilizing a traditional metal heat sink and plastic reflectors and/or diffusers.

According to a second aspect of the inventive concept there is provided a method for providing a lighting device comprising: providing an electrically conducting layer, mounting at least one light source on an upper surface of the electrically conducting layer, fastening the electrically conducting layer on an electrically insulating heat sink element, such that a lower side of the electrically conducting layer is arranged in direct contact with the heat sink element, wherein the step of fastening the electrically conducting layer on the heat sink element is done by means of a mechanical fastening means. Thus, a very simple, highly recognizable, mechanical solution, which requires only a few components, for mounting of a lighting device with a light source in e.g. a light bulb is achieved. The method is advantageously suitable for mass production of lighting devices.

According to an embodiment of the method, further comprising a step of providing an electrical lead pattern to the electrically conducting layer, which is advantageous. The step of providing an electrical lead pattern may advantageously be done by means of stamping. Stamping is advantageous since a large number of electrical lead patterns may be simultaneously stamped out from an electrically conducting layer, like a roll of copper foil. It should however be emphasized that other suitable methods are applicable for obtaining a lead pattern are applicable for the inventive concept.

According to an embodiment of the method, it further comprises providing an electrically insulating layer, and arranging the electrically insulating layer onto the electrically conducting layer.

These and other aspects, features, and advantages of the inventive concept will be apparent from and elucidated with reference to the embodiments described hereinafter. It is noted that the invention relates to all combinations of features, even if those are recited in different claims.

BRIEF DESCRIPTION OF THE DRAWINGS

The inventive concept will now be described in more detail and with reference to the appended drawings in which.

DESCRIPTION OF PREFERRED EMBODIMENTS

The present inventive concept will now be described more fully hereinafter with reference to the accompanying drawings. The below embodiments are provided by way of example so that this disclosure will be thorough and complete, and will fully convey the scope of the inventive concept to those skilled in the art. Like numbers refer to like elements throughout. Further, in the following, the invention is described with reference to a light emitting diode, LED, as preferred embodiment of the light source. This includes single LEDs, multicolor LEDs, phosphor-LEDs, LED packages comprising multiple LEDs etc. Further, the present inventive concept is applicable for both solid state light emitting diodes and organic light emitting diodes, OLEDs.

Figure 1:
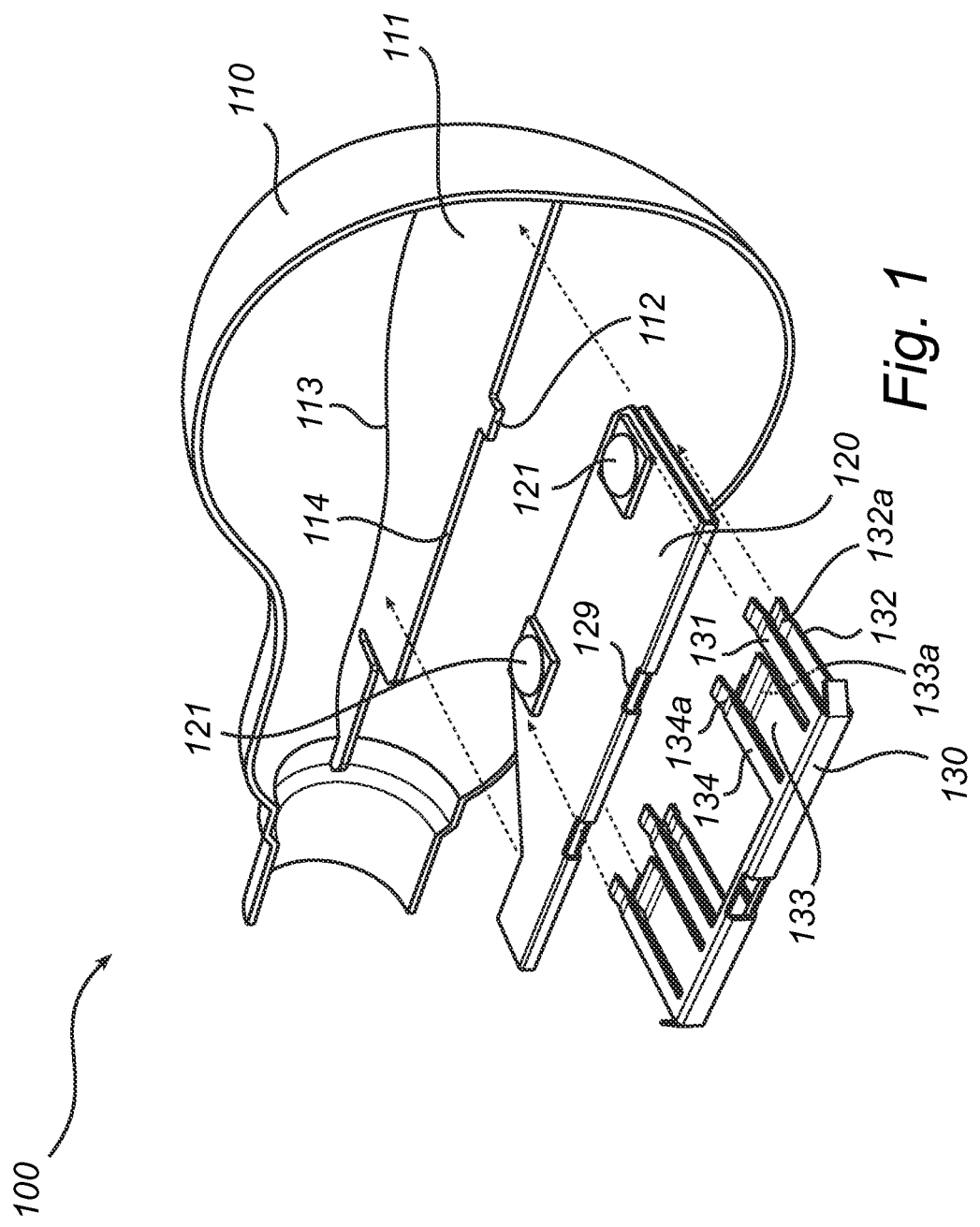
FIG. 1 is a cut open exploded perspective view illustrating the main parts of an embodiment of a lighting device according to the present inventive concept.

FIG. 1 is a cut open perspective view of a lighting device 100 according to the present inventive concept showing one half of the lighting device, which is exploded to illustrate the main parts thereof. Further, in this figure, the cap for connecting the lighting device to a lighting fixture, and electrical wires for connecting the power to the light source, are left out for sake of simplicity. The lighting device 100 comprises light sources 121 arranged to generate light, which are mounted on a substrate 120. The substrate 120 is described in more detail herein under with reference to FIGS. 3 and 4.

The light sources 121 are here single white or blue amber red green LEDs which are soldered onto electrical leads (not visible) arranged on the substrate 120. The lighting device further comprises an envelope 110, herein after referred to as the bulb. A heat sink element 111 is arranged as a protruding portion from an inner surface of the bulb 110, onto which heat sink element 111 the substrate 120 is positioned when the lighting device 100 is assembled. The heat sink element 111 is here plate shaped with an inner profile 113 following the inner curvature of the bulb 110, and a straight opposite outer edge 114. A protruding portion 112 is arranged on the outer edge 114 to provide a guide head for the substrate 120 and a clamp 130 for clamping the substrate to the heat sink element 111, which clamp is described herein under. The heat sink element 111 and the bulb 110 are thermally coupled, and may in alternative embodiments be formed as one integrated piece.

According to embodiments of the lighting device, the envelope may be manufactured in one piece, or be formed by at least two parts which are joined together to form the envelope (not shown).

According to an embodiment of the lighting device, the envelope, and optionally also the heat sink element, comprises ceramic material. The ceramic material may for instance be based on one or more materials selected from the group consisting of $Al_2O_3$, AlN, $SiO_2$, $Y_3Al_5O_{12}$ (YAG), an $Y_3Al_5O_{12}$ analogue, $Y_2O_3$ and $TiO_2$, and $ZrO_2$. The term an $Y_3Al_5O_{12}$ analogue refers to garnet systems having substantially the same lattice structure as YAG, but wherein Y and/or Al and/or O, especially Y and/or Al are at least partly replaced by another ion, such as one or more of Sc, La, Lu and G, respectively. The term "based on" indicates that the starting materials to make the ceramic material substantially consist of one or more of the herein indicated materials, such as for instance $Al_2O_3$ or $Y_3Al_5O_{12}$ (YAG). This does however not exclude the presence of small amounts of (remaining) binder material, or dopants, such as Ti for $Al_2O_3$, or in an embodiment Ce for YAG. The ceramic material may have a relatively good thermal conductivity. Preferably, the thermal conductivity is at least about 5 W/mK, such as at least about 15 W/mK, even more preferably at least about 100 W/mK. YAG has a thermal conductivity in the range of about 6 W/mK, poly crystalline alumina (PCA) in the range of about 20 W/mK, and AlN (aluminum nitride) in the range of about 150 W/mK or larger.

To continue, with reference to FIG. 1, the heat sink element 111 and the bulb 110 are made of $Al_2O_3$, which is a translucent material. $Al_2O_3$ can also be made highly reflective when it is sintered at a temperature in the range of about 1300-1700° C., such as in the range of about 1300-1500° C., like 1300-1450° C. This material is also known in the art as "brown" PCA (polycrystalline alumina).

Figure 2:
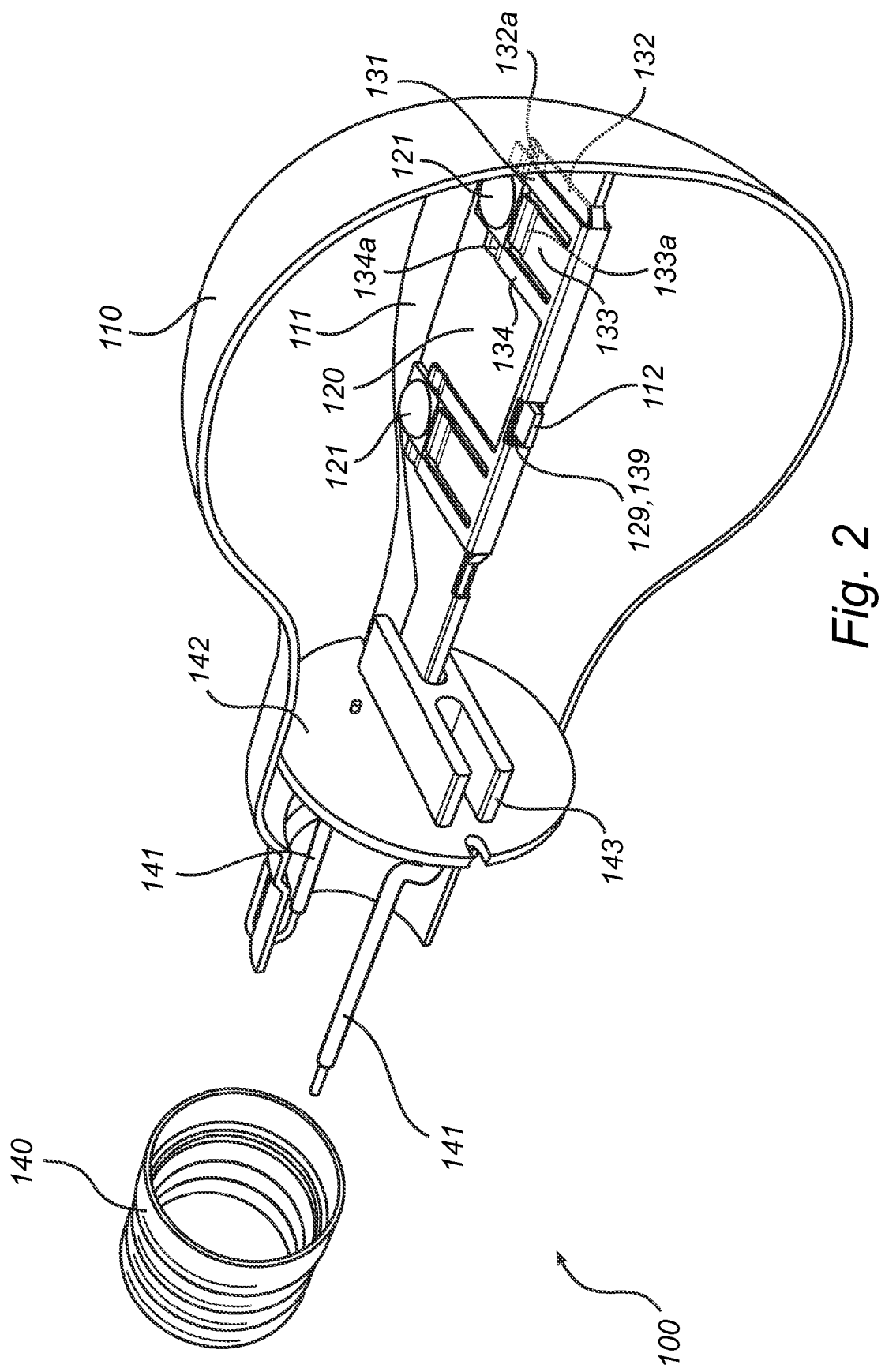
FIG. 2 is a cut open perspective view illustrating an embodiment of a lighting device according to the present inventive concept.

In an assembled state of the lighting device 100, as depicted in FIG. 2, the bulb 110 encloses the light sources 121 and the heat sink element 111. The lighting device further comprises a metal clamp 130 arranged for fixating the substrate 120 to the heat sink element 111 when assembled. The substrate 120 is here folded about a fold axis to fit around the heat sink element 111 and is provided with an opening 129 arranged at the fold axis to receive the protruding portion 112, i.e. the guide head on the heat sink element 111 when mounted. The clamp 130 is a cut out metal foil which has been shaped and folded about a fold axis to form a clamp with two sets of opposing resilient clamping parts. The clamp 130 is arranged to receive the heat sink element 111 and the substrate 120 between these two sets of opposing resilient clamping parts, which thereby provide a mechanical force that compresses the substrate 120 and the heat sink element 111. The two sets of opposing resilient clamping parts of the clamp 130 are partly illustrated in FIG. 1, in which the subparts 131, 133, and 134 which together form the upper set for holding one of the light sources 121 are fully visible. As it can be seen the extension of the subparts 131 and 134 in a forward direction from the fold axis of the clamp 130 is longer than for the subpart 133, which is arranged between the subparts 131 and 134. The length of the subpart 133 defines a predetermined distance from the fold axis. Further, the lateral separation between the subparts 131 and 134 is selected such that the light source is advantageously received by the clamp 130. Thereby, positioning in two dimensions of the light source 121 on the heat sink element 11 is achieved by means of the clamp 130, i.e. the distance from the back axis, and the lateral position by the positioning of the recess formed by the separation of the subparts 131 and 134.

The profiles of the subparts 131, 132, 133, 134 (and further subparts which are not visible in the Figs.) of the clamp 130 are arranged with rounds 131a-134a, for creating contact surfaces, which surfaces face the heat sink element 111 in a mounted position, such that the mechanical force from the clamp is distributed to predetermined positions, preferably close to the light source 121. By arranging a predetermined design, resilience and material of the clamp 130, a predetermined distributed mechanical force is applied to fixate, and to ensure sufficient thermal connection of, the substrate 120 and the heat sink element 111.

In an embodiment of the lighting device, the fastening means is a clamp comprising two opposite clamping parts that can be brought together by means of e.g. a screw, or a spring, to provide the fastening of the substrate on the heat sink element (not shown).

To continue with reference to FIG. 2, it further illustrates the powering details for the lighting device 100. At an entrance of the bulb 110, a supply board 142 is arranged such that a receiving connector portion 143 faces the heat sink element 111. Thus, when mounted the heat sink element 111 and supply board 142 are fixed together. Electrical leads (not visible here, see 122 in FIG. 4a) are arranged on the substrate 120, which is positioned such that the electrical leads connect to the connector portion 143 when mounted therein. Electrical interconnection of the light sources 121 and the driver is thus provided at the edge of the substrate 120 and in the connector portion 143, which in turn is coupled via electrical wires 141 to the driver circuitry arranged in the cap 140 (not shown).

Figure 4A:
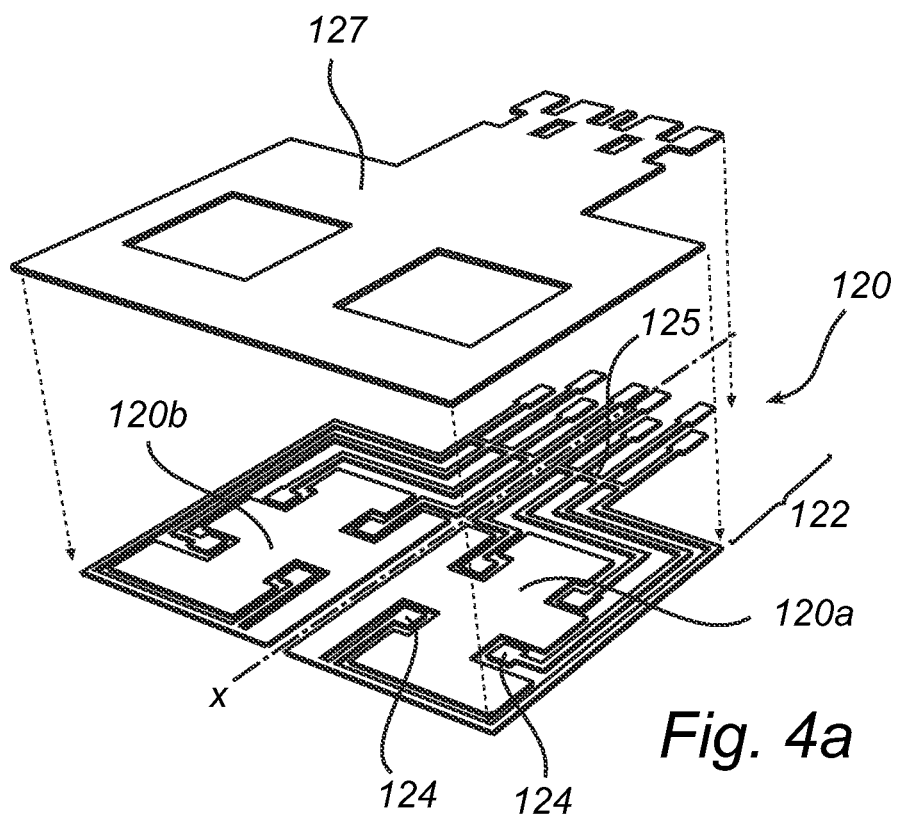
FIGS. 4a-b illustrate parts of an embodiment of a lighting device according to the present inventive concept.
Figure 4B:
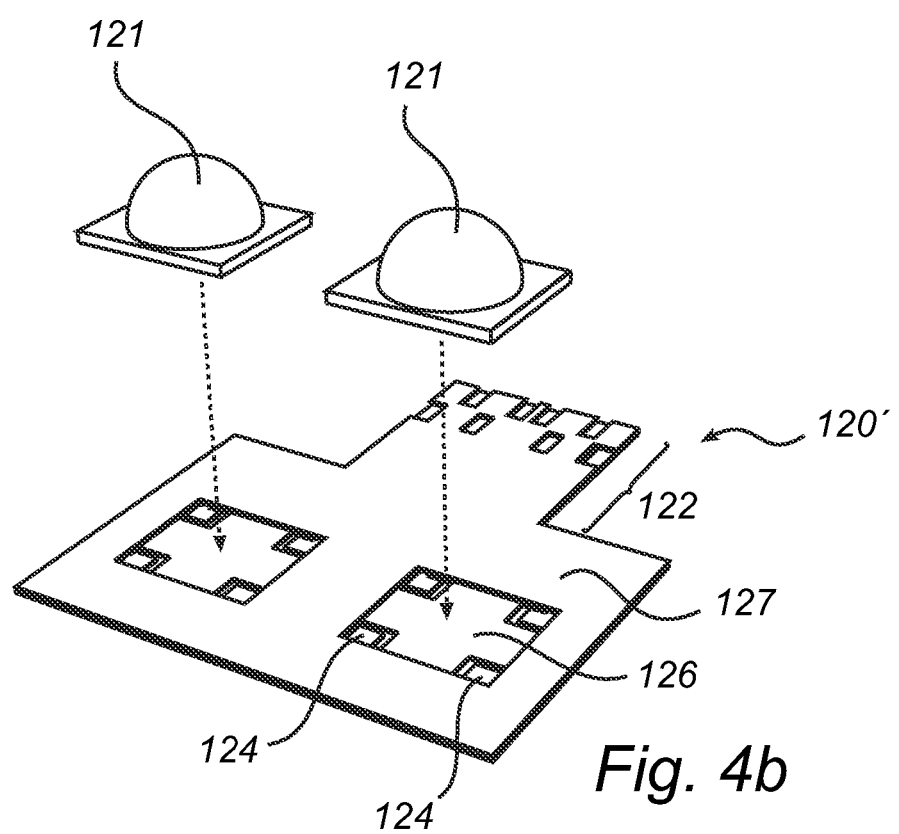
Figure 5:
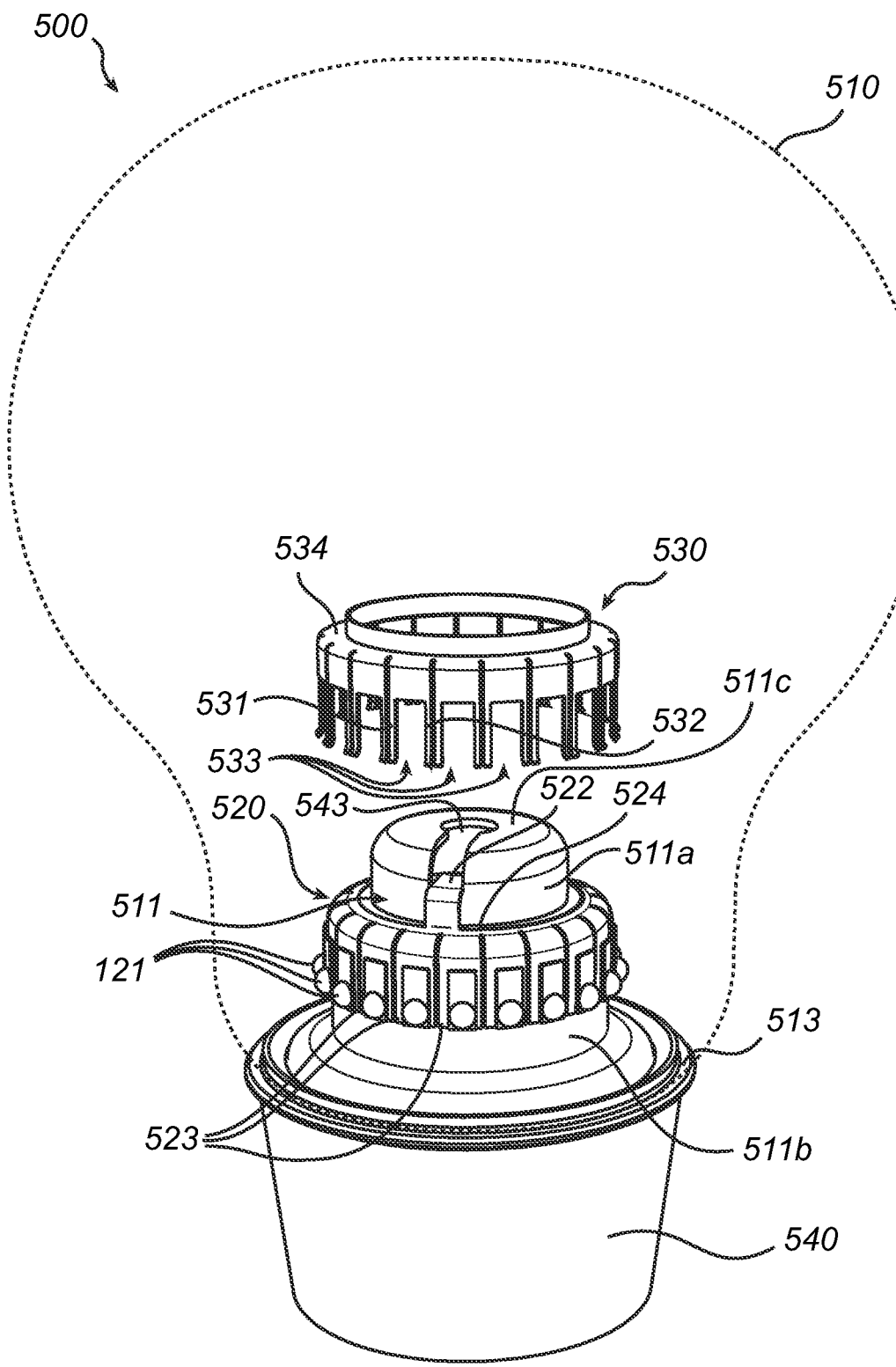
FIG. 5 is a perspective view of an embodiment of a lighting device according to the present inventive concept.

In an embodiment of the lighting device 500, described with reference to FIG. 5, the lighting device 500 comprises a hollow and substantially cylindrically shaped ceramic heat sink 511 which has a partly closed upper surface 511c, and which is connected to a cap 540 on the opposite lower end. The cylinder shape of the heat sink 511 is provided in two steps, 511a and 511b, with two different diameters, such that the upper part 511a of the heat sink element has a smaller diameter then the lower part 511b. In the upper surface 511c of upper part 511a, an opening 543 is provided. The lighting device 500 further comprises a flexible substrate 520 which comprises of a plurality of rectangular substrate portions 523, which each at an upper end portion is attached to a uniting strip 524 which forms a circle, matching the outer diameter of the upper part 511a of the heat sink element 511. The substrate 520 is arranged with electrical leads (not visible) arranged under an insulating top layer. At each substrate portion 523, a respective light source 121 is soldered to connection pads which are not covered by the insulating top layer (the connection pads are not visible here, but compare to pads 124 for electrical connection to a light source in to FIG. 4b). When manufacturing the substrate 520, the substrate portions 523 may advantageously be processed from a rectangular portion comprising the substrate portions 523 and the uniting strip 524 (during stamping, providing insulating layer, mounting of light sources etc.). Subsequently, the outer ends of the uniting strip 524 are joined together such that the uniting strip forms a circle. Further, a supply portion 522 for connecting to the driver is attached to the uniting strip 524.

The substrate 520 is arranged on top of the heat sink element 511 such that the upper part 511a is protruding through the uniting strip 524. The substrate portions 523, are spaced around the heat sink element, and due to their flexibility they are suspended from the uniting strip 524, basically covering the side wall of the lower part 511b of the heat sink element. The supply portion 522 is arranged to enter into the heat sink element 511 via the opening 543, and is further connected to the driver circuitry (not shown).

To fixate the substrate 520 to the heat sink element 511, a clamp 530 is arranged over the substrate 520. The clamp 530 is a ring shaped metal clip which has a plurality of clamp portions 533 adapted to fit each substrate portion 523. The clamp portions 533 are thus, in order to fit to a corresponding substrate portion 523, arranged spaced around a unifying upper rim 534. A recess in each clamp portion 533 is formed by two adjacently arranged subparts 531 and 532. The recess is provided for the clamp 530 to fixate the light sources 121 of the substrate 520 in predetermined positions. The upper rim 534 is arranged having an opening with an inner diameter suitable for allowing the upper part 511a of the heat sink element 511 to protrude through the opening. The shape of the clamp 530 is adapted to receive the lower part 511b of the heat sink while distributing a mechanical force to fixate the substrate portions 523 and thereby provide a sufficient thermal contact between the substrate 520 and the heat sink element 511.

According to an embodiment of the lighting device, the fastening means is arranged in an electrically insulating material, like e.g. plastics.

According to an embodiment of the lighting device, the substrate is an electrically conducting layer which comprises two subparts which are electrically separated, e.g. with a gap (not shown). The light source anode is electrically attached to one of the subparts and the light source cathode is electrically attached to the other subpart. The substrate is positioned directly on the heat sink element, and fixated to it by means of a plastic clamp.

Figure 6:
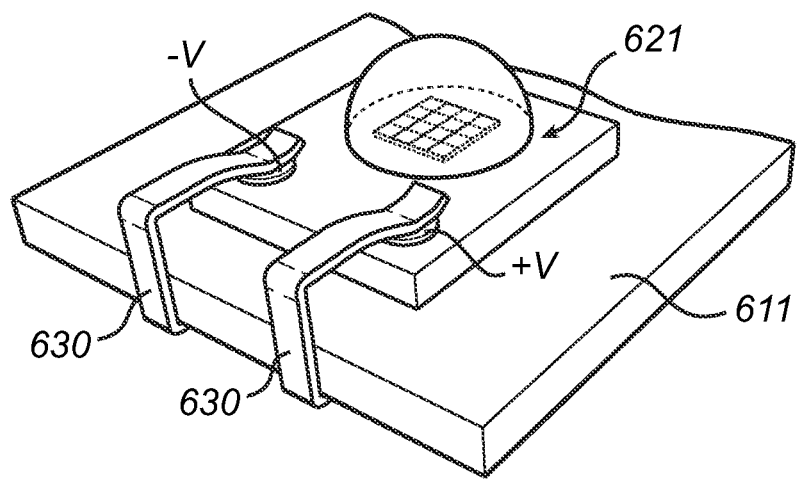
FIG. 6 is a perspective view of an embodiment of a lighting device according to the present inventive concept.

According to an embodiment of the lighting device, as illustrated in FIG. 6, the light source here being a LED package 621, is arranged on a ceramic heat sink element 611, such that its heat pad (not visible) is put directly on the ceramic surface. Plastic clamps 630, which are arranged with electrical contacts (not visible), are arranged to hold the LED package in a predetermined position, and to connect the LED package electrically. The clamps may alternatively be completely made of an electrically conducting material and thereby provide the electrical contacts.

The fastening means, e.g. the clamp, above is described by way of example and it should be emphasized that other suitable designs are applicable and are considered to fall within the scope of the inventive concept.

To continue now with reference to FIG. 3, an embodiment of a method for assembling of a lighting device according to the inventive concept is described in more detail. The method is formed for facilitating mass production of lighting devices. To form a large quantity of substrates for lighting devices according to the present inventive concept, initially a copper foil (or sheet) or other suitable metal foil, is provided. A roll of the copper foil 301 is fed into a stamping press 350, in which electrical lead patterns for a multiple of substrates are punched out simultaneously in each process step (that is, stepwise or continuously in a forward traveling process). The electrical lead pattern for each substrate is preferably designed to provide the electrical connections needed for each individual light source, and in addition to provide a large enough copper area for providing a sufficiently low thermal resistance between a finished substrate and its corresponding heat sink element. See FIG. 4, which illustrates the finished electrical lead pattern for a substrate 120, in which pads 122 for connection to the connector portion 143 as described above, pads 124 for electrical connection to a light source, and copper surfaces 120a, 120b for providing thermal connection surfaces are shown. In FIG. 4, the electrical lead pattern is arranged for connection of two LED packages 121. A fold axis x is indicated in the figure, to illustrate that the finished substrate, after mounting of the light sources 121, will be folded.

According to an embodiment of the method, and referring again to FIG. 3, the finished substrates are preferably provided with an insulating layer. To manufacture insulating layers for a large quantity of substrates, here a roll of foil of fiberglass reinforced epoxy (FR4) is provided. Other standard materials used in PCBs are applicable for use as insulating layer, e.g. PI, and PA.

Figures 3A, 3B, 3C:
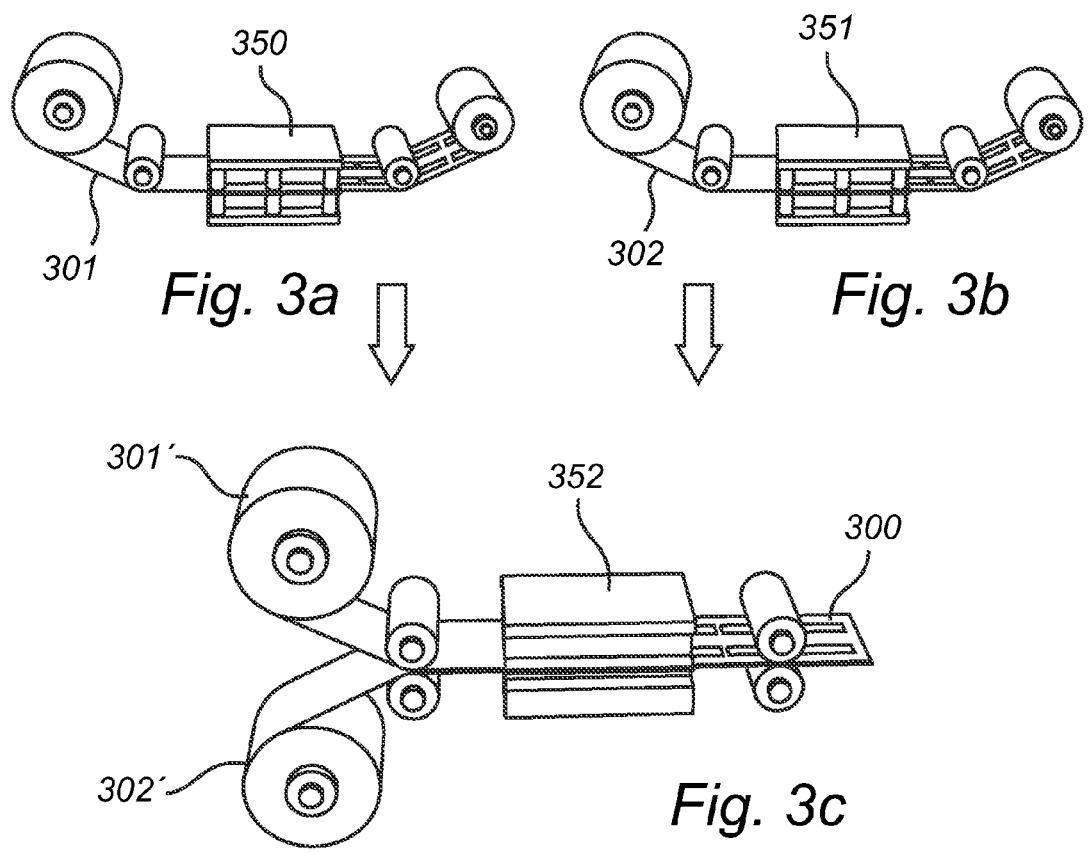
FIGS. 3a-c are schematic illustrations of steps in an embodiment of a method for assembling a lighting device according to the present inventive concept.

In FIG. 3b the roll of insulating foil 302 is fed into a stamping press 351, in which a number of patterns, corresponding to the number of stamped substrates in the copper foil 301, and adapted to fit onto a respective substrate, are punched out simultaneously in each process step (that is, stepwise or continuously in a forward traveling process). The pattern is adapted to cover the electrical lead pattern of each substrate, preferably covering the whole upper surface of the electrically conducting layer 120 except for the areas dedicated for electrical connections, and for areas onto which the light sources are to be mounted, see FIG. 4b, where an insulating layer 127 is attached to the copper layer, i.e. substrate 120, of FIG. 4a. The insulating layer is covering the whole surface of the electrically conducting layer 120 with the exceptions of areas for the connection pads 122, and 124, and the areas 126 onto which the LEDs 121 are to be mounted.

To continue now with reference to FIG. 3c, the stamped copper foil 301' and the stamped insulating foil 302' are trimmed to position and thereafter glued together in a gluing machine 352, thereby forming a roll of connected substrates 300.

Before separating the substrates, the light sources are arranged onto an upper surface of the roll of connected substrates 300 by means of standard techniques for placing and mounting of the light sources, like pick and place machines and reflow soldering (not shown).

The substrates are then separated and ready for fastening onto a heat sink element in a lighting device envelope. The final substrate may be stiff or flexible. Flexible substrates facilitates for folding the substrate about the heat sink element to take advantage of two sides of a flat heat sink element, thereby allowing light sources on both sides of the heat sink element. The substrate is arranged with its lower side facing the heat sink element, i.e. the bare copper is arranged directly to the heat sink element.

According to an embodiment of the method, the step of fastening the electrically conducting layer on the heat sink element is done by means of a mechanical fastening means.

Figure 7A:
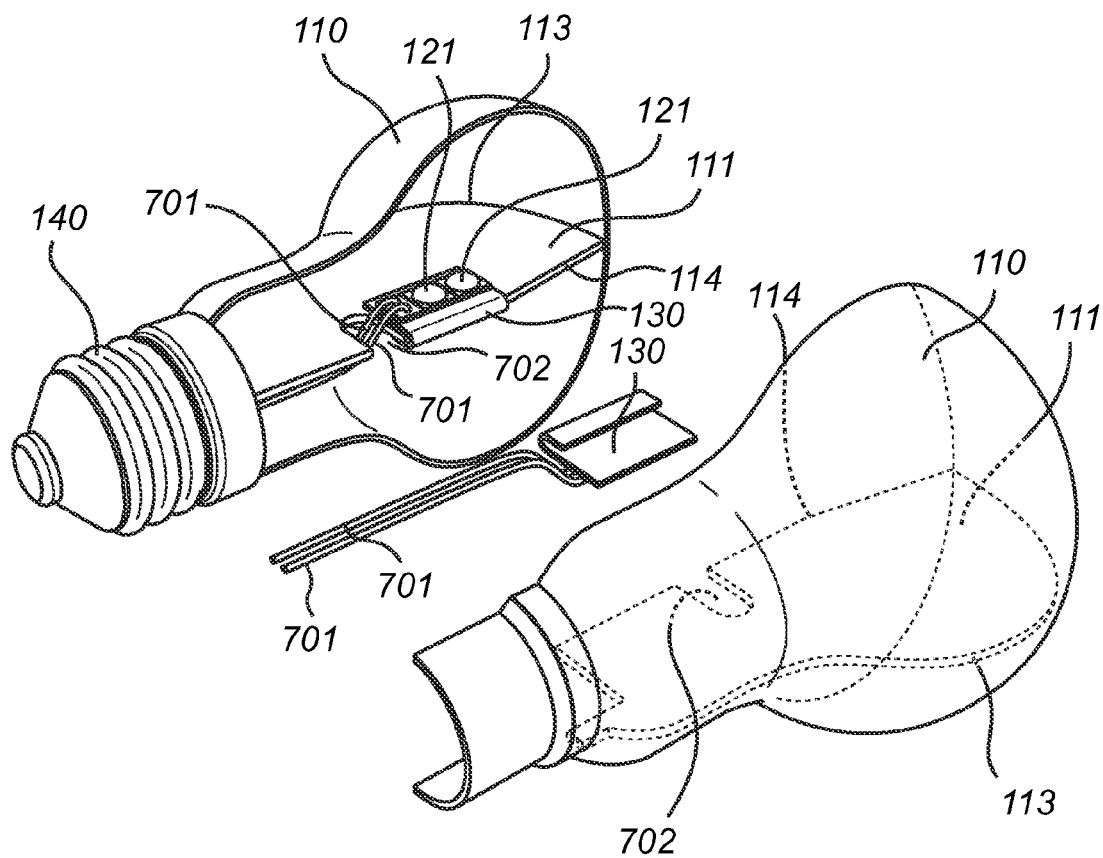
FIGS. 7a-b and 8 illustrate embodiments of a lighting device according to the present inventive concept.
Figure 7B:
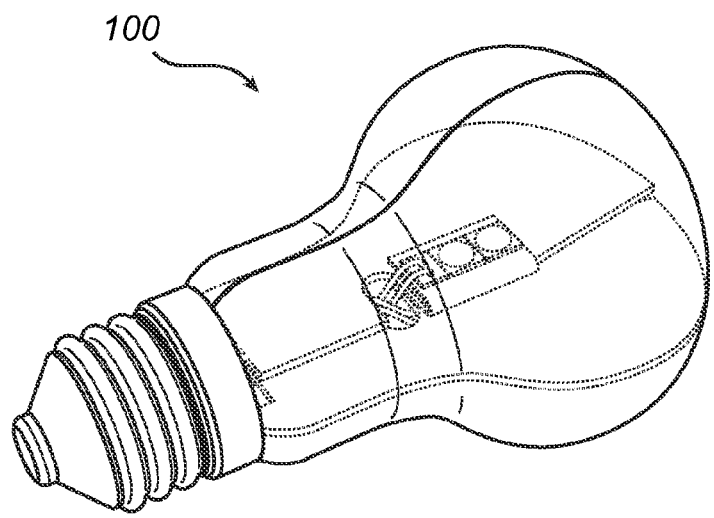
Figure 9:
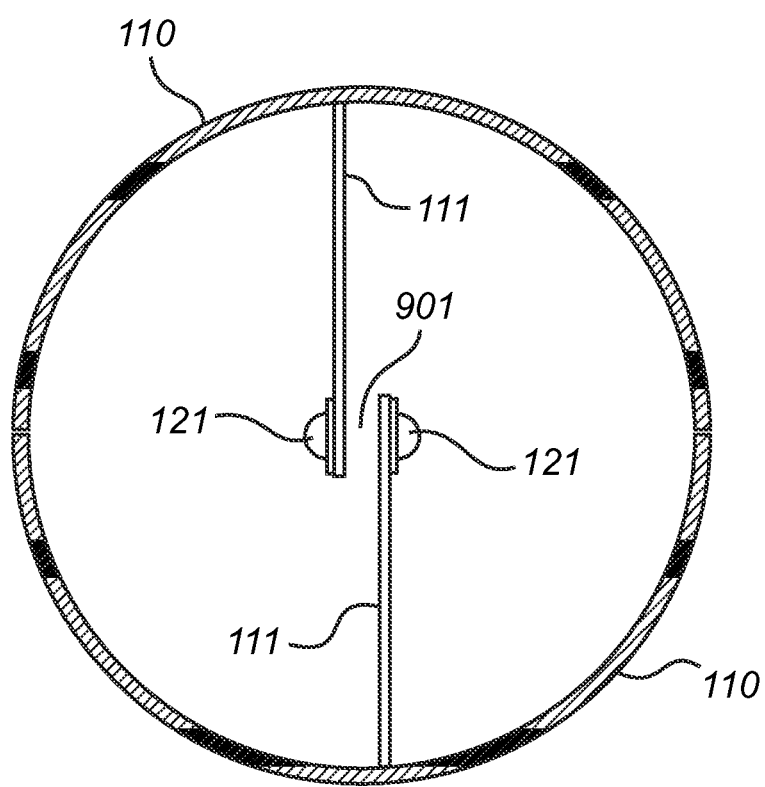
FIG. 9 is a schematic cross-sectional top view of either of the embodiments of FIGS. 7a-b and 8.

FIGS. 7a-b and 9 illustrate an embodiment of a lighting device 100 according to the present inventive concept. In FIG. 7a, the lighting device is illustrated in a disassembled state to show its main parts, while FIG. 7b shows the lighting device in an assembled state. FIG. 9 is a simplified cross-sectional top view of the lighting device shown in FIG. 7b in an assembled state.

The lighting device 100 comprises light sources 121, arranged to generate light, which are mounted on two clamps 130. The light sources 121 are, e.g., LEDs of arbitrary color. It should be noted that there are light sources not visible in FIGS. 7a-b since they are mounted face down on one of the clamps 130. In the present embodiment, the clamps 130 act as electrically conductive layers, e.g., including metal particles or metal elements at positions where they help reduce thermal resistance between the top and bottom sides of the layer.

The clamps 130 and light sources 121 are enclosed by an envelope which consists of two bulb-shaped enveloping parts 110. Two heat sink elements 111 are arranged as portions protruding from inner surfaces of the enveloping parts 110. Each heat sink element 111 is plate shaped with an inner profile 113 following the inner shape of the enveloping parts 110, and a straight opposite outer edge 114. In the present embodiment, the enveloping parts 110 and heat sink elements 111 are all in thermal contact after the lighting device is assembled, so that they can be regarded as one large heat sink element. Each of the clamps 130 is fastened to one of these heat sink elements 111. By suitably selecting the shape, resilience and material of the clamps 130, a predetermined distributed mechanical force is applied to fixate the clamps 130 and to ensure sufficient thermal connection between the clamps 130 and the heat sink elements 111.

The lighting device 110 comprises a cap 140 for connecting the lighting device to a lighting fixture, e.g., a screw base. Wires 701 are arranged in electric contact with the light sources 121, preferably by being bonded to upward facing terminals thereon, and are mechanically attached to the clamps 130 via the light sources 121. The wires 701 are arranged to pass through respective indentations 702 cut out in the heat sink elements 111, so that each wire 701 is located on that side of the heat sink element 111 which is opposite to the light source 121 which the wire 701 powers.

With reference to FIG. 9, the heat sink elements 111 are separated by a constant distance. In between the heat sink elements, an overlap zone 901 is defined. After passing through the indentations 702, the wires 701 are led through the overlap zone 901 to the cap 140. Hence, when the cap 140 is connected to a power source, the wires 701 may supply electric power to the light sources 121.

A lighting device 100 according to the present embodiment can be assembled in two steps. One step comprises forming two halves, each consisting of one enveloping part 110 and one heat sink element 111, optionally molded as one common piece, e.g., of a ceramic material. In each of these halves, a clamp 130, light sources 121 and wires 701 are arranged. In a second step, the two halves are assembled together to form the lighting device 100, and a cap 140 may also be attached.

Figure 8:
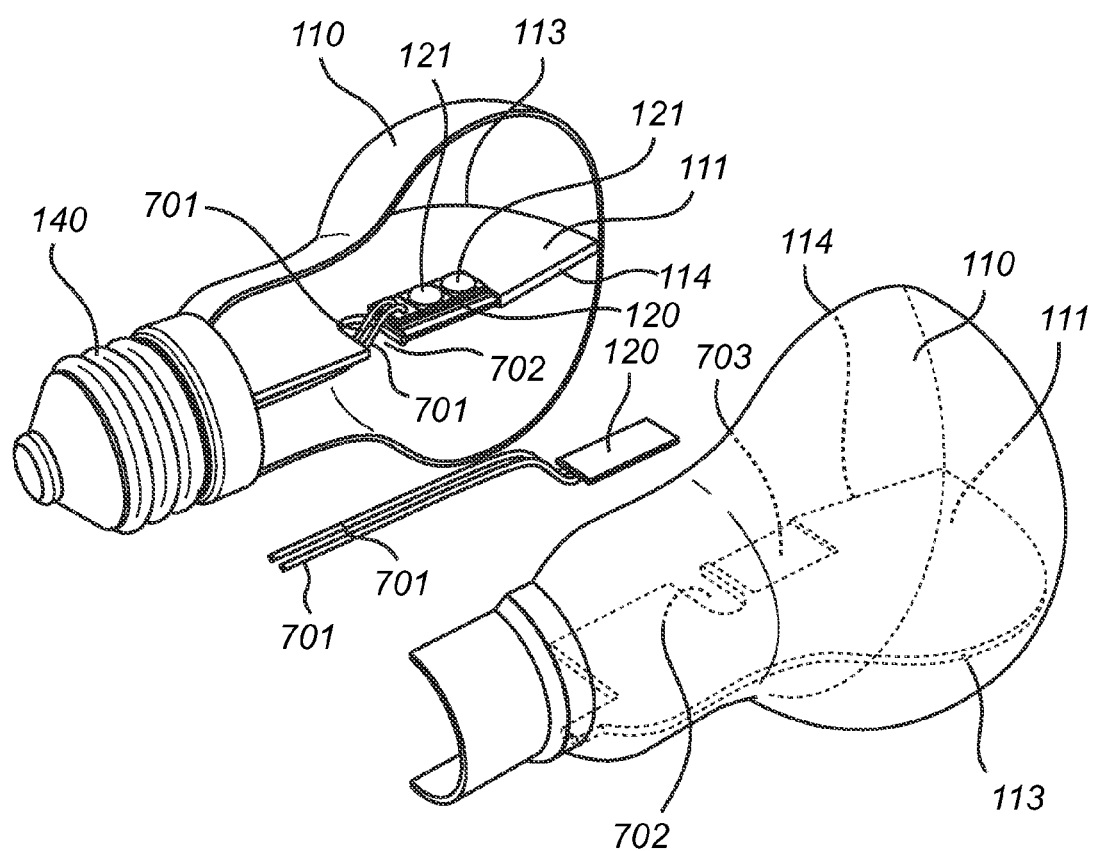

FIG. 8 illustrates an embodiment of a lighting device 100 according to the present inventive concept. The lighting device is illustrated in a disassembled state to show its main parts. FIG. 9 is a cross-sectional top view of the lighting device shown in FIG. 8, however in an assembled state, The lighting device 100 comprises light sources 121, arranged to generate light, which are mounted on electrically conductive layers 120, e.g. including metal particles or metal elements at positions where they help reduce thermal resistance between the top and bottom sides of the layer. The light sources may be provided as a LED package on the electrically conductive layer 120 or may be mounted on a naked die acting as the electrically conductive layer 120; the latter option is preferable when excellent thermal conductivity across the heat-sink/conductive layer interface is desired. In such circumstances, electric conductivity in this layer is not a mandatory feature. It should be noted that there are light sources not visible in FIG. 8 since they are mounted face down on one of the electrically conducting layers 120. The light sources 121 are, e.g., LEDs of arbitrary color. The light sources 121 and electrically conductive layers 120 are enclosed by an envelope consisting of two enveloping parts 110. Two heat sink elements 111 are arranged as portions protruding from inner surfaces of the enveloping parts 110. Each heat sink element 111 is plate shaped with an inner profile 113 following the inner shape of the enveloping parts 110, and a straight opposite outer edge 114. In the present embodiment, the enveloping parts 110 and heat sink elements 111 will all be in thermal contact after the lighting device 100 is assembled, so that they can be regarded as one large heat sink element.

In each of the heat sink elements 111 there is provided a recess 703 with a shape corresponding to that of one of the electrically conducting layers 120. The electrically conductive layers 120 are glued onto the heat sink elements 111, whereby the recesses 703 help align the corresponding electrically conductive layers 120 and hence also the light sources 121. When the electrically conductive layers 120 are received in their respective recesses 703, the movement of the electrically conductive layers 120, in their respective planes, is limited.

The lighting device 100 comprises a cap 140 for connecting the lighting device to a lighting fixture, e.g., a screw base. Wires 701 extending from the cap 140 are attached at one end to the electrically conductive layer 120, more precisely in electric contact with the light sources 121. The wires 701 are arranged to pass through indentations 702 cut out in the edges of the heat sink elements 111, so that each wire 701 is located on that side of the heat sink element 111, which is opposite to the light source 121 which the wire 701 powers.

With reference to FIG. 9, which is common to FIGS. 7 and 8, the heat sink elements 111 are separated by a constant distance. In between the heat sink elements 111, an overlap zone 901 is defined. After passing through the indentations 702, the wires 701 are led through the overlap zone 901 to the cap 140. Thereby, when the cap 140 is connected to a power source, the wires 701 may supply electric power to the light sources 121.

A lighting device 100 according to the present embodiment can be assembled in two steps. One step comprises forming two halves, each consisting of one enveloping part 110 and one heat sink element 111, optionally molded as one common piece, e.g., of a ceramic material. In each of these halves, an electrically conductive layer 120, light sources 121 and wires 701 may be arranged. In a second step, the two halves are assembled together to form the lighting device 100, and a cap 140 may also be attached.

Above, embodiments of the lighting device and method according to the present inventive concept as defined in the appended claims have been described. These should be seen as merely non-limiting examples. As understood by a skilled person, many modifications and alternative embodiments are possible within the scope of the inventive concept. It is to be noted, that for the purposes of this application, and in particular with regard to the appended claims, the word "comprising" does not exclude other elements or steps, and the word "a" or "an", does not exclude a plurality.

The invention claimed is:

1. A lighting device comprising:
at least one light source arranged to generate light and mounted on an electrically conductive flexible substrate;
an electrically insulating heat sink element;
a bulb forming an envelope and in thermal connectivity with the insulating heat sink element;
said at least one light source arranged in contact with said electrically flexible substrate;
a fastener compressively extending about the flexible substrate and the heat sing element;
the electrically conducting flexible substrate folded about a fold axis around the heat sink element;
the fastener including a first and a second leg separated by a recess, the recess receiving the at least one light source between the first and second leg.

2. A lighting device comprising:
at least one light source arranged to generate light and mounted on an electrically conductive flexible substrate;
an electrically insulating heat sink element;
a bulb forming an envelope in thermal connectivity with the insulating heat sink element;
the electrically conductive flexible substrate sized to be retained on the heat sink element by a mechanical fastener;
the at least one light source arranged in contact with the electrically flexible substrate;

the electrically conducting flexible substrate folded about a fold axis around the heat sink element;
wherein the fastener positioned on the electrically insulating heat sink aligns the electrically conductive layer and limits the movement of the at least one light source.

3. The lighting device of claim 2 wherein the bulb includes a first half and a second half, each of the first half and the second half having an electrically insulating heat sink element.

4. A lighting device comprising:
at least one light source arranged to generate light;
an electrically insulating heat sink element; and
a flexible electrically conducting layer;
wherein said at least one light source is arranged in contact with said electrically conducting layer,
wherein said electrically conducting layer is mounted to said heat sink element by means of a mechanical fastener and
wherein the electrically conducting layer is folded about a fold axis around the heat sink element;
the mechanical fastener includes at least a first and a second leg separated by a recess, the recess receiving the at least one light source between the first and second leg such that the light source is received by the mechanical fastener positioning, in two dimensions, the light source on the heat sink element when the fastener is installed about the heat sink element.

5. A lighting device according to claim 4, wherein said fastener is arranged for distributing a mechanical force at predetermined positions.

6. A lighting device according to claim 4, wherein said fastener is a clamp.

7. A lighting device according to claim 4, wherein said electrically conducting layer is arranged having electrical leads arranged for powering of said at least one light source.

8. A lighting device according to claim 4, wherein said electrically conductive layer is arranged in said fastener.

9. A lighting device comprising:
at least one light source arranged to generate light;
an electrically insulating heat sink element having a recess;
a flexible electrically conducting layer;
wherein said at least one light source is arranged in contact with said electrically conducting layer;
wherein said electrically conducting layer is mounted to said heat sink element by an adhesive in the recess;
wherein the electrically conducting layer is folded about a fold axis around the heat sink element;
the adhesive positioning, in two dimensions, the light source on the heat sink element when the light source is installed on the heat sink element;
said recess formed in the heat sink element having the shape of the electrically conducting layer; and
said electrically conductive layer affixed to said heat sink element in the recess by the adhesive.

10. A lighting device according to claim 4, wherein said heat sink element comprises a ceramic material.

11. The lighting device of claim 4 wherein each of the first and second leg further each are arranged with a round for creating contact surfaces facing the heat sink element such that the mechanical force of the mechanical fastener is distributed to predetermined positions to fixate and ensure sufficient thermal connection of the heat sink element and the conducting layer.

12. A lighting device according to claim 4, further comprising an insulating layer arranged at said electrically conducing layer.

13. A lighting device according to claim 12, wherein at least one of the insulating layer and the fastener are reflective.

14. The lighting device of claim 4 wherein the mechanical fastener includes a fold axis.

15. The lighting device of claim 14 wherein the mechanical fastener includes a central subpart between the first and second leg which extends a central predetermined distance from the fold axis which is less than a predetermined distance of the first or second leg.

16. A lighting device according to claim 4, further comprising an envelope enclosing said light source and said heat sink element.

17. A lighting device according to claim 16, wherein said heat sink element is thermally coupled to said envelope.

18. A lighting device according to claim 16, wherein at least part of said heat sink element and said envelope are one single integrated part.

19. A lighting device according to claim 4, further comprising flexible linear electric connection means extending up to said at least one light source.

20. A lighting device according to claim 19, wherein each of said linear connection means is located on that side of said heat sink element which is opposite to the light source up to which this linear connection means extends.

21. A lighting device according to claim 20, wherein said heat sink element comprises two overlapping parts between which is defined an overlap zone, in which said linear connection means are arranged.

* * * * *